United States Patent
Liu et al.

(10) Patent No.: US 9,831,276 B2
(45) Date of Patent: Nov. 28, 2017

(54) DISPLAY PANEL

(71) Applicant: InnoLux Corporation, Miao-Li County (TW)

(72) Inventors: Yu-Tsung Liu, Miao-Li County (TW); Te-Yu Lee, Miao-Li County (TW); Chien-Ta Huang, Miao-Li County (TW); Minoru Shibazaki, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 98 days.

(21) Appl. No.: 14/953,667

(22) Filed: Nov. 30, 2015

(65) Prior Publication Data

US 2016/0155755 A1 Jun. 2, 2016

(30) Foreign Application Priority Data

Dec. 2, 2014 (TW) .............................. 103141744 A
Feb. 12, 2015 (TW) .............................. 104104707 A

(51) Int. Cl.
| | |
|---|---|
| *G02F 1/136* | (2006.01) |
| *H01L 27/12* | (2006.01) |
| *H01L 27/32* | (2006.01) |
| *H01L 27/15* | (2006.01) |
| *H01L 51/52* | (2006.01) |

(Continued)

(52) U.S. Cl.
CPC ........ *H01L 27/124* (2013.01); *H01L 27/1248* (2013.01); *H01L 27/156* (2013.01); *H01L 27/3248* (2013.01); *H01L 27/3276* (2013.01); *H01L 51/5284* (2013.01);

(Continued)

(58) Field of Classification Search
USPC ........................ 349/43, 106, 110; 257/59, 72
See application file for complete search history.

(56) References Cited

U.S. PATENT DOCUMENTS 6,323,918 B1 * 11/2001 Yoshioka .......... G02F 1/136209
349/111
6,630,971 B1 * 10/2003 Woo .................. G02F 1/133753
349/110

(Continued)

FOREIGN PATENT DOCUMENTS

| TW | 575777 B | 2/2004 |
|---|---|---|
| TW | 200809740 A | 2/2008 |

(Continued)

*Primary Examiner* — Edward Glick
*Assistant Examiner* — David Chung
(74) *Attorney, Agent, or Firm* — Bacon & Thomas, PLLC

(57) ABSTRACT

A display panel is disclosed, which comprises a first substrate including: a base substrate; a semiconductor layer; a first insulating layer; a first scan line and a second scan line extended along a first direction respectively and portions of the first scan line and the second scan line overlapping with the semiconductor layer; a second insulating layer; a data line extended along a second direction and electrically connecting to the semiconductor layer through a first contact via, wherein the second direction is different from the first direction; and a first metal pad and a second metal pad electrically connecting to the semiconductor layer through two second contact vias respectively; wherein the first contact via and the two second contact vias are disposed between the first scan line and the second scan line.

13 Claims, 14 Drawing Sheets

(51) Int. Cl.
    *H01L 33/62*    (2010.01)
    *H01L 33/52*    (2010.01)
    *H01L 33/58*    (2010.01)

(52) U.S. Cl.
    CPC .............. *H01L 33/52* (2013.01); *H01L 33/58* (2013.01); *H01L 33/62* (2013.01)

(56) References Cited

U.S. PATENT DOCUMENTS

2002/0171086 A1* 11/2002 Miyajima ......... G02F 1/136213
                                                          257/72
2012/0147314 A1*  6/2012 Yoshizawa ............ G02B 5/201
                                                          349/144
2013/0242237 A1*  9/2013 Nagato ............. G02F 1/133509
                                                          349/105

FOREIGN PATENT DOCUMENTS

TW       201245829 A     11/2012
TW       201310150 A      3/2013

* cited by examiner

DISPLAY PANEL

CROSS REFERENCE TO RELATED APPLICATION

This application claims the benefits of the Taiwan Patent Application Serial Number 104104707, filed on Feb. 12, 2015, which also claims the benefits of the Taiwan Patent Application Serial Number 103141744, filed on Dec. 2, 2014, the subject matters of which are incorporated herein by reference.

BACKGROUND OF THE INVENTION

1. Field of the Invention

The present disclosure relates to a display panel, more particularly, to a display panel with an improved aperture ratio, wherein the aperture ratio is improved by adjusting the wiring arrangement and the wiring structure of an array substrate.

2. Description of Related Art

In general, a liquid crystal display panel is assembled by an array substrate with active units such as a thin-film transistor, a color filter substrate with units such as color filters, and a liquid crystal disposed between the array substrate and the color filter substrate. The display panel usually comprises black matrices in the wiring regions, where the data lines and the scanning lines are arranged, as well as in the transistor regions. This is to prevent color-mixing, to increase contrast ratio, and to prevent uneven alignment of the alignment layer caused by the transistors.

As the demand for high-resolution display devices increases, improvement in the aperture ratio of the display devices by reducing black matrix has become one of the important issues in the field. However, due to the conventional designs of transistors and wiring, there is limitation in the improvement of the aperture ratio of display devices by reducing black matrix while preventing color-mixing and maintaining contrast ratio. Therefore, there is a need to develop a display device with a high aperture ratio while still having the features provided by black matrix as described above. Specifically, in the present disclosure, the aperture ratio is improved by adjusting the wiring arrangement and the wiring structure of the array substrate.

SUMMARY OF THE INVENTION

The present disclosure provides a display panel comprising a first substrate, a display layer, and a second substrate, wherein the display layer is disposed between the first substrate and the second substrate. The first substrate comprises: a base substrate; a semiconductor layer disposed on the base substrate; a first insulating layer disposed on the semiconductor layer; a first scan line and a second scan line disposed on the first insulating layer and extended along a first direction respectively, and portions of the first and the second scan lines overlapping with the semiconductor layer; a second insulating layer disposed on the first scan line, the second scan line, and the first insulating layer; a data line disposed on the second insulating layer and extended along a second direction, and the data line electrically connecting to the semiconductor layer through a first contact via, wherein the second direction is different from the first direction; and a first metal pad and a second metal pad disposed on the second insulating layer, and the first metal pad and the second metal pad electrically connecting to the semiconductor layer through two second contact vias respectively; wherein the first contact via and the two second contact vias are disposed between the first scan line and the second scan line.

In one embodiment, the display panel may further comprise: a third insulating layer disposed on the first metal pad, the second metal pad, and the second insulating layer; a first pixel electrode layer disposed on the third insulating layer, wherein the first pixel electrode layer electrically connects to the first metal pad through a third contact via; and a second pixel electrode layer disposed on the third insulating layer, wherein the second pixel electrode layer electrically connects to the second metal pad through another third contact via.

In one embodiment, the first pixel electrode layer and the second pixel electrode layer are disposed adjacently at the same side of the data line.

In one embodiment, the first pixel electrode layer and the second pixel electrode layer are disposed adjacently at different sides of the data line. In addition, the first scan line has a first inner edge and a first outer edge. The second scan line also has a second inner edge and a second outer edge. The first inner edge is adjacent to the second inner edge.

In one embodiment, the first pixel electrode layer overlaps with the first inner edge and the first outer edge of the first scan line. The second pixel electrode layer overlaps with the second inner edge and the second outer edge of the second scan line.

In one embodiment, the first pixel electrode layer and the second pixel electrode layer are disposed between the first outer edge of the first scan line and the second outer edge of the second scan line.

In one embodiment, the display panel may further comprise a plurality of light-shielding layers disposed between the base substrate and the semiconductor layer, wherein the light-shielding layers are disposed in regions corresponding to an area of the semiconductor layer which overlaps with the first scan line and another area of the semiconductor layer which overlaps with the second scan line.

In one embodiment, the display panel may further comprise a buffer layer disposed between the base substrate and the semiconductor, wherein the light-shielding layers are disposed between the base substrate and the buffer layer.

In one embodiment, the display panel may further comprise a first black matrix layer and a second black matrix layer disposed between the first substrate and the second substrate, wherein the first black matrix layer covers at least the first scan line or the second scan line, and the second black matrix layer covers at least the data line.

In one embodiment, a width of the first black matrix layer is in a range from 5 µm to 50 µm.

In one embodiment, the second substrate is a color filter substrate. The second substrate comprises at least four pixel arrays of different colors. Each of the pixel arrays comprises four pixel units of an identical color adjacent to each other, which are a first pixel unit, a second pixel unit, a third pixel unit, and a fourth pixel unit. The first black matrix layer or the second black matrix layer is disposed between the pixel arrays of different colors.

In one embodiment, the second substrate is a color filter substrate. The second substrate comprises at least three rows of pixel arrays of different colors. Each of the pixel arrays comprises a plurality of pixel units of an identical color arranged along the second direction. The first black matrix layer is disposed between two adjacent pixel units and another two adjacent pixel units of each pixel array.

In one embodiment, the display panel may further comprise a first black matrix layer and a second black matrix layer disposed between the first substrate and the second substrate, wherein the first black matrix layer covers at least the first scan line or the second scan line, and the second black matrix layer covers at least a portion of the data line.

In one embodiment, the second substrate is a color filter substrate. The second substrate comprises at least three pixel arrays of different colors. Each of the pixel arrays comprises two pixel units of an identical color adjacent to each other and arranged along the first direction. The first black matrix layer is disposed between the pixel arrays.

DETAILED DESCRIPTION OF THE EMBODIMENT

As the demand for high-resolution display devices increases, the improvement in the aperture ratio of display devices by reducing the area of black matrix has become a major subject in the field. Herein, the present disclosure achieves the object to improve the aperture ratio of a display panel by adjusting the wiring arrangement and the wiring structure of an array substrate.

In the present disclosure, the materials used for each component of the array substrate will not be particularly limited. Any materials known in the art may be used. For example, in one embodiment of the present disclosure, the base substrate may be a transparent substrate such as a transparent plastic substrate or a glass substrate; the buffer layer may be silicon nitride, silicon oxide, or a combination thereof; the semiconductor layer may be amorphous silicon, low-temperature poly-silicon, or metal oxide; the first insulating layer may be silicon oxide, silicon nitride, silicon oxynitride, or hafnium oxynitride; the second insulating layer (or also called passivation layer) may be silicon nitride, silicon oxide, or a combination thereof; the first scan line, the second scan line (or also called gate electrode layer) and the first metal pad, the second metal pad (or also called source electrode layer) may be formed by conductive materials such as molybdenum, aluminum, copper, titanium, or a combination thereof; the third insulating layer may be perfluoroalkoxy polymer resin (PFA), fluoroelastomers, or the like; and the first pixel electrode layer and the second pixel electrode layer may be formed by transparent conductive oxides such as indium tin oxide, indium zinc oxide, aluminum zinc oxide, or the like.

Hereafter, examples will be provided to illustrate the embodiments of the present disclosure. Other advantages and effects of the disclosure will become more apparent from the disclosure of the present disclosure. Moreover, in the present disclosure, various modifications and variations can be made without departing from the spirit of the disclosure based on various concepts and applications.

[Embodiment 1]

Figure 1:
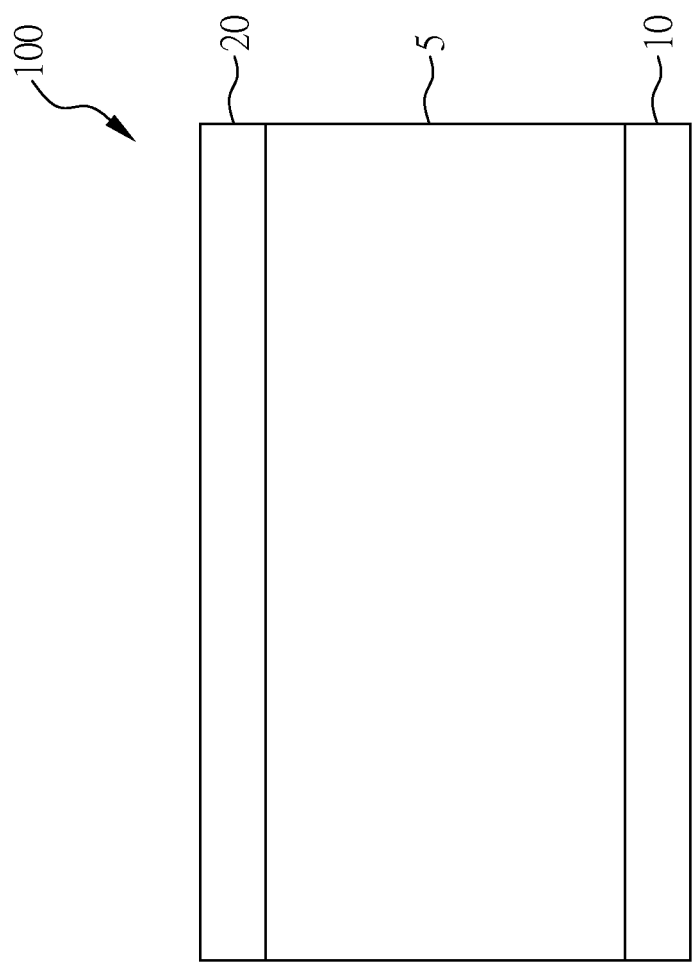
FIG. 1 is a schematic diagram of a display panel of Embodiment 1.

Please refer to FIG. 1, which is a schematic diagram of a display panel 100 of Embodiment 1. As shown in FIG. 1, the display panel 100 comprises a first substrate 10, a display layer 5, and a second substrate 20. The display layer 5 is disposed between the first substrate 10 and the second substrate 20. The first substrate 10 and the second substrate 20 are an array substrate and a color filter substrate, respectively. The display layer 5 may be a liquid crystal layer or an electroluminescence layer such as organic light emitting diode layer or inorganic light emitting diode layer.

Figure 2:
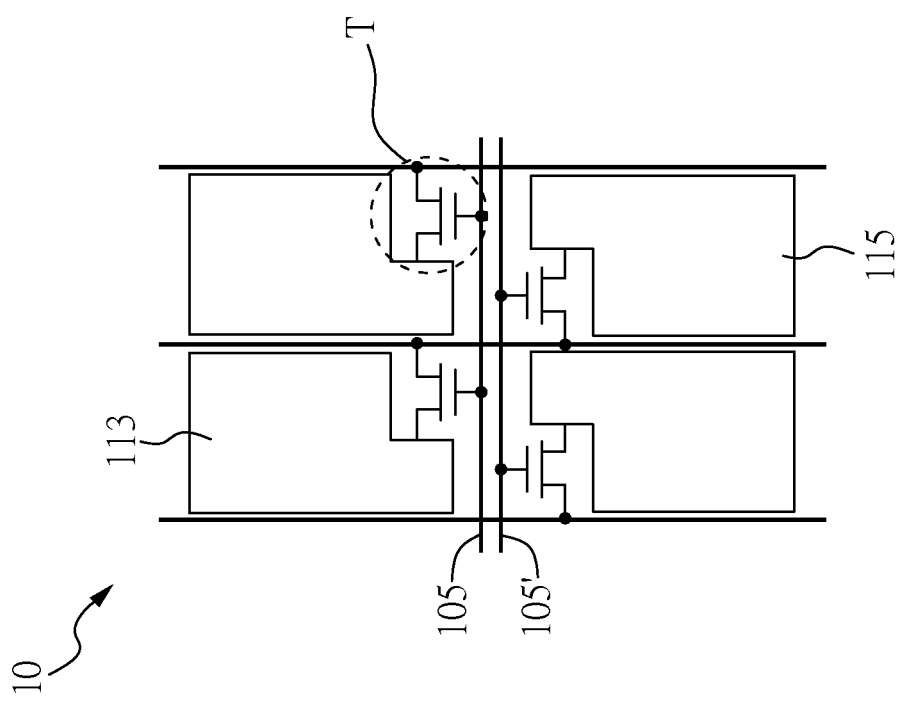
FIG. 2 is a schematic diagram of a wiring arrangement of a first substrate of Embodiment 1.

Please refer to FIG. 2, which is a schematic diagram of a wiring arrangement of a first substrate 10 of Embodiment 1. As shown in FIG. 2, Embodiment 1 discloses a centralized arrangement of non-transparent units of adjacent pixels (such as first scan line 105, second scan line 105', and thin film transistor unit T) by adjusting the wiring arrangement of the first substrate 10.

Figure 3:
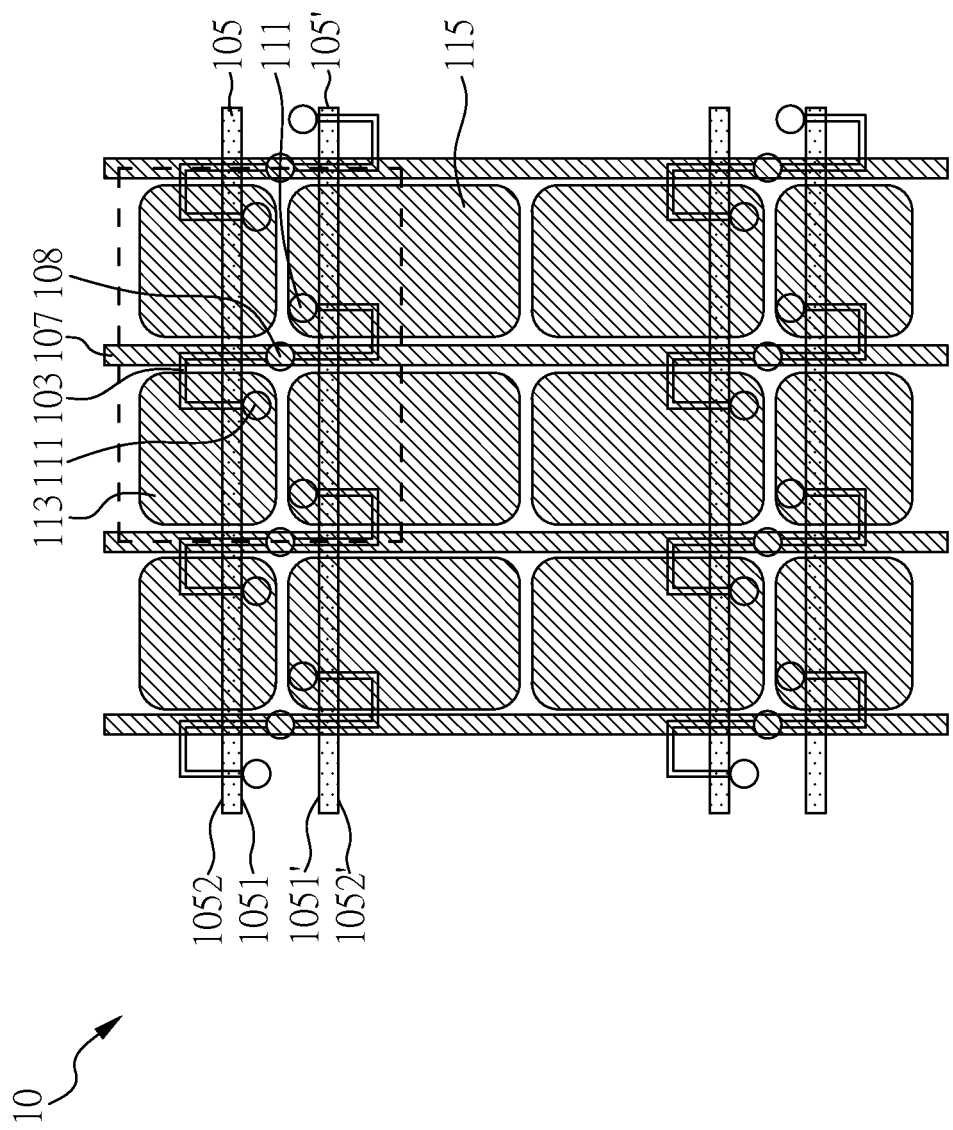
FIG. 3 is a schematic diagram of a wiring structure of a first substrate of Embodiment 1.

Please refer to FIG. 3, which is a schematic diagram of a wiring structure of a first substrate 10 of Embodiment 1. FIG. 3 only shows the relative positions of units such as semiconductor layer 103; first scan line 105; second scan line 105'; data line 107 (or also called drain electrode layer); first contact via 108 and second contact via 111 for electrical connection; first pixel electrode layer 113; and second pixel electrode layer 115 in order to show the technical features of the present disclosure more clearly.

As shown in FIG. 3, a data line 107 is electrically connected to a semiconductor layer 103 through a first contact via 108. The semiconductor layer 103 is electrically connected to a first pixel electrode layer 113 and a second pixel electrode layer 115 through two second contact vias 111 and two third contact vias 114, 114' (shown in FIG. 5). The first contact via 108 and the two second contact vias 111 are disposed between a first scan line 105 and a second scan line 105'. The first pixel electrode layer 113 and the second pixel electrode layer 115 are disposed at different sides of the data line 107. The first scan line 105 has a first inner edge 1051 and a first outer edge 1052. The second scan line 105' also has a second inner edge 1051' and a second outer edge 1052'. The first inner edge 1051 is adjacent to the second inner edge 1051'. The first pixel electrode layer 113 overlaps with the first inner edge 1051 and the first outer edge 1052 of the first scan line 105. The second pixel electrode layer 115 overlaps with the second inner edge 1051' and the second outer edge 1052' of the second scan line 105'.

Figure 4:
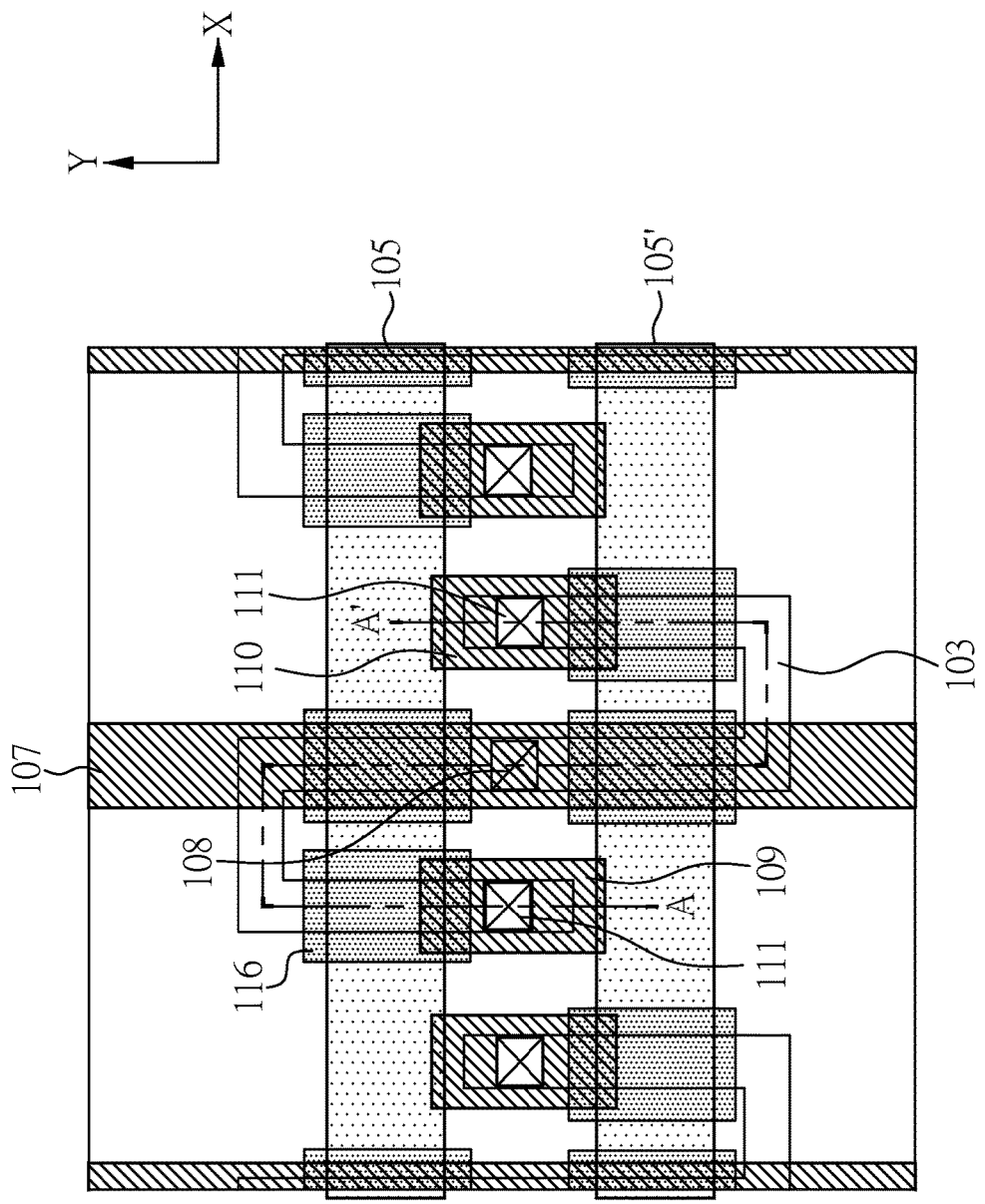
FIG. 4 is a top view of a first substrate of Embodiment 1.
Figure 5:
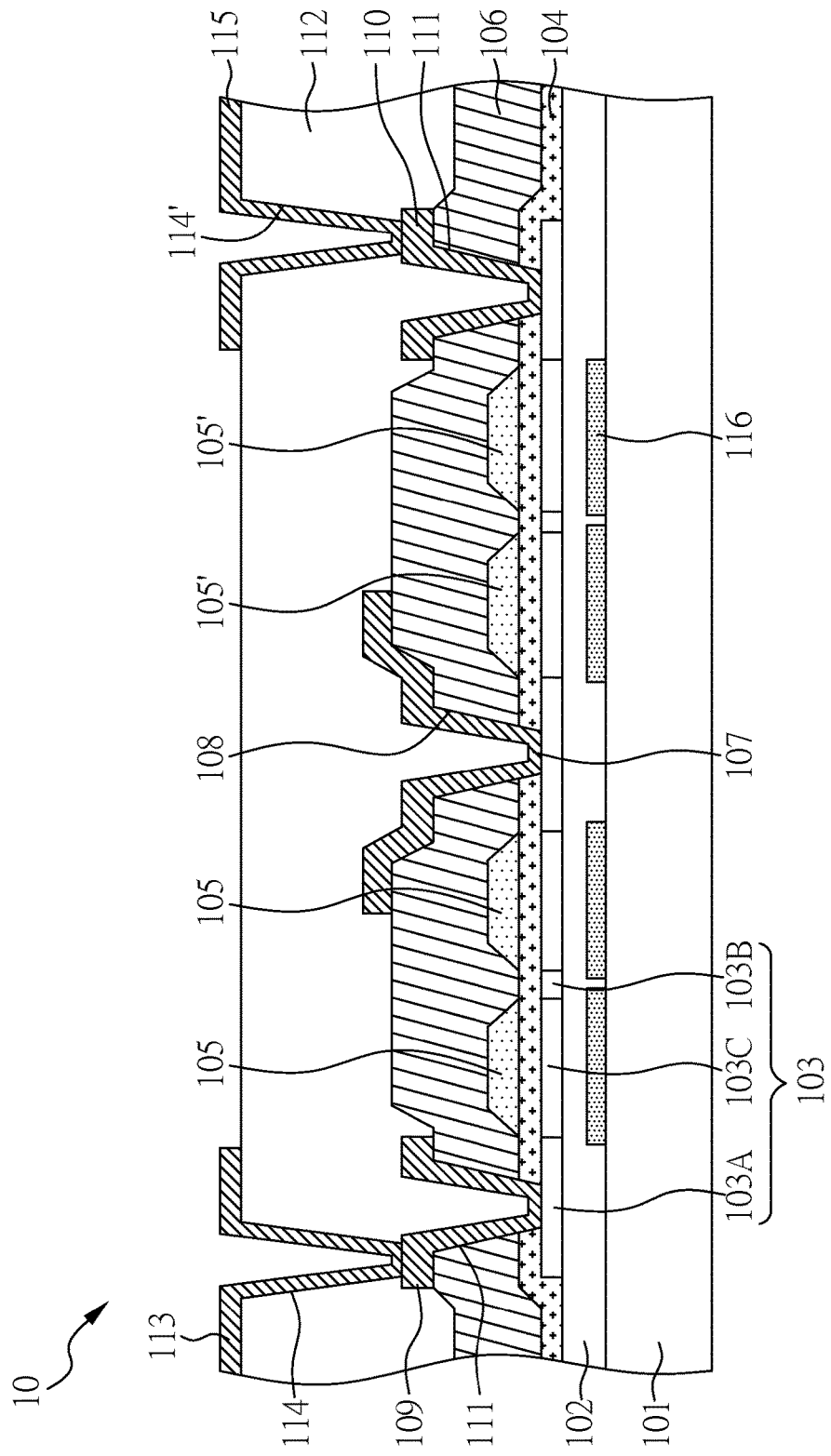
FIG. 5 is a cross-sectional view along the A-A' cutting line of the first substrate in FIG. 4.

Please refer to FIG. 4 and FIG. 5. FIG. 4 is a top view of a first substrate 10 of Embodiment 1 (corresponding to the dashed box in FIG. 3). FIG. 5 is a cross-sectional view along the A-A' cutting line of the first substrate 10 in FIG. 4. In order to show the technical features of the present disclosure more clearly, some of the units in FIG. 4 that can also be seen in FIG. 5 (such as pixel electrode and third insulating layer) are omitted in FIG. 4.

As shown in FIG. 4 and FIG. 5, the first substrate 10 of Embodiment 1 comprises: a base substrate 101; a buffer layer 102 disposed on the base substrate 101; a semiconductor layer 103 disposed on the buffer layer 102; a first insulating layer 104 disposed on the buffer layer 102 and the semiconductor layer 103; a first scan line 105 and a second scan line 105' disposed on the first insulating layer 104 and extended along a first direction (X direction in FIG. 4) respectively, and portions of the first scan line 105 and the second scan line 105' overlap with the semiconductor layer 103; a second insulating layer 106 disposed on the first scan line 105, the second scan line 105', and the first insulating layer 104; a data line 107 disposed on the second insulating layer 106 and extended along a second direction (Y direction in FIG. 4), and the data line 107 electrically connects to the semiconductor layer 103 through a first contact via 108, wherein the second direction is different from the first direction; and a metal pad 109 and a second metal pad 110 disposed on the second insulating 106, and the first metal pad 109 and the second metal pad 110 electrically connect to the semiconductor layer 103 through two second contact via 111 respectively. As shown in FIG. 4, the first contact via 108 and the two second contact vias 111 are disposed between the first scan line 105 and the second scan line 105'.

As shown in FIG. 4 and FIG. 5, the first substrate 10 further comprises: a third insulating layer 112 disposed on the first metal pad 109, the second metal pad 110, and the second insulating layer 106; a first pixel electrode layer 113 disposed on the third insulating layer 112, and the first pixel electrode layer 113 electrically connects to the first metal pad 109 through a third contact via 114; a second pixel electrode layer 115 disposed on the third insulating layer 112, and the second pixel electrode layer 115 electrically connects to the second metal pad 110 through another third contact via 114'; and a plurality of light-shielding layers 116 disposed between the base substrate 101 and the semiconductor layer 103, and the light-shielding layers 116 are disposed in regions corresponding to an area of the semiconductor layer 103 overlapping with the first scan line 105 as well as another area of the semiconductor layer 103 overlapping with the second scan line 105'.

In Embodiment 1, the material used for the semiconductor layer 103 may be a low-temperature poly-silicon. As shown in FIG. 5, the semiconductor layer 103 comprises a source/drain electrode region 103A, a wiring region 103B, and an un-doped channel region 103C disposed between the source/drain electrode region 103A and the wiring region 103B. The source/drain electrode region 103A is doped with proper dopant (such as boron or phosphorus) or is doped with metal (such as aluminum).

In Embodiment 1, by adjusting the wiring arrangement and the wiring structure of the first substrate, active units of switches for sub-pixels may have a centralized arrangement. Consequently, the width of a black matrix layer on a second substrate, which is a color filter substrate, corresponding to a portion of the first substrate where the non-transparent active units are disposed may be increased. Meanwhile, the width of a black matrix layer on the second substrate that corresponds to a portion of the first substrate where the non-transparent active units are not disposed may be reduced. Subsequently, the total area ratio of black matrix layer may be reduced and the aperture ratio of display panel may be increased.

Figure 6B:
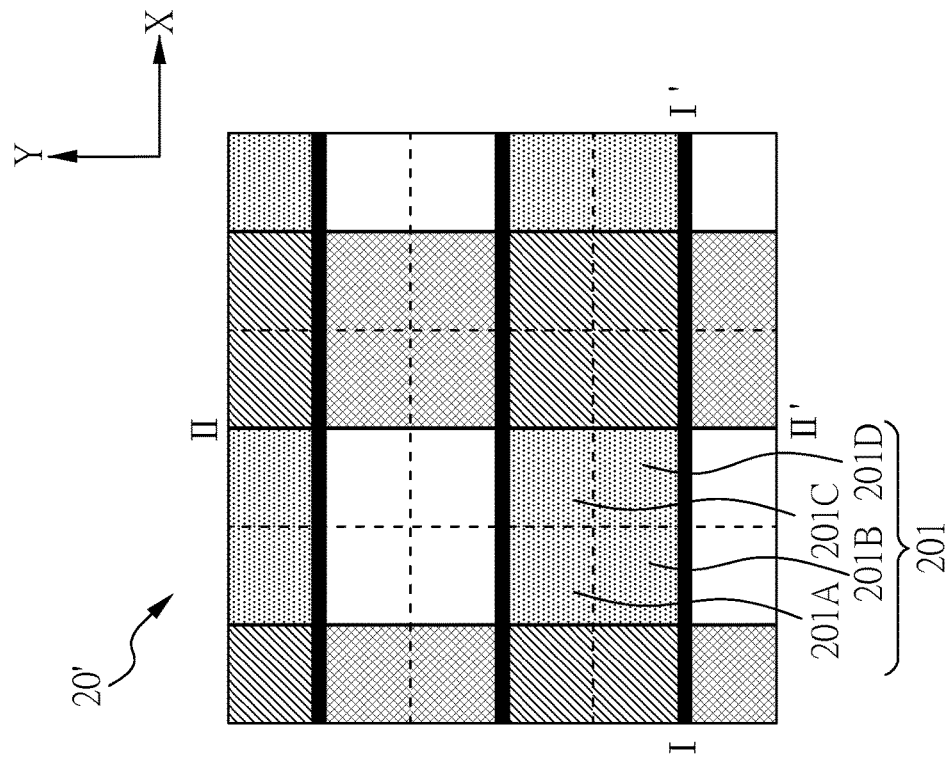
FIG. 6B is a schematic diagram of a second substrate of Embodiment 2.
Figure 6A:
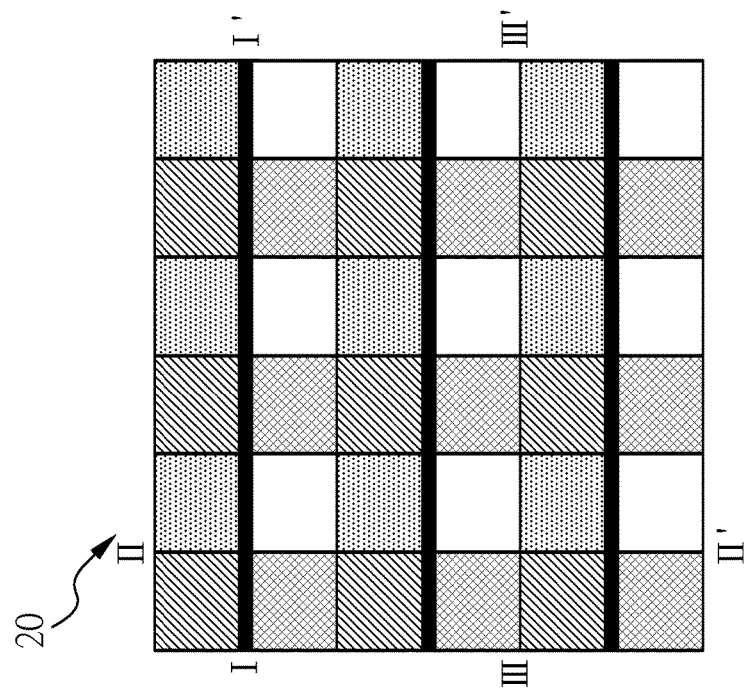
FIG. 6A is a schematic diagram of a second substrate of Embodiment 1.

Specifically, please refer to FIG. 1 and FIG. 6A. FIG. 6A is a schematic diagram of a second substrate 20 of Embodiment 1. As shown in FIG. 1 and FIG. 6A, the display panel 100 further comprises a first black matrix layer I-I' and a second black matrix layer II-II' disposed between the first substrate 10 and the second substrate 20. Specifically, the first black matrix layer I-I' and the second black matrix layer II-II' are disposed on the second substrate 20. The first black matrix layer I-I' is disposed in a region that corresponds at least to the first scan line 105 and the second scan line 105' shown in FIG. 4. The first black matrix layer I-I' is a strip-like shield that extends along the first direction (X direction in FIG. 6A). The width of the first black matrix layer I-I' is sufficient to cover the first scan line 105 and the second scan line 105' simultaneously. The second black matrix layer II-II' is disposed in a region that corresponds at least to the data line 107 shown in FIG. 4. In Embodiment 1, the width of the first black matrix layer I-I' is ranging from 5-50 μm, and the width of the second black matrix layer II-II' is ranging from 2-20 μm. Furthermore, as shown in FIG. 6A, the display panel further comprises a third black matrix layer III-III' with a width ranging from 2-20 μm. The third black matrix layer III-III' is parallel to the first black matrix layer I-I' to prevent color-mixing between adjacent pixel units of different colors on the second substrate.

Accordingly, as shown in FIG. 1 to FIG. 6A, the total area ratio of the black matrix layers of the display panel 100 of Embodiment 1 may be reduced by adjusting the wiring arrangement and the wiring structure of the first substrate 10, which is an array substrate, to improve the aperture ratio of the display panel 100.

[Embodiment 2]

Embodiment 2 is substantially similar to Embodiment 1, except that the configuration of the pixel units of the color filter of a second substrate, which is a color filter substrate, is different in Embodiment 2.

Please refer to FIG. 6B, which is a schematic diagram of a second substrate 20' of Embodiment 2. As shown in FIG. 6B, the second substrate 20' comprises at least four pixel arrays 201 of different colors. Each of the pixel arrays 201 comprises four pixel units of an identical color adjacent to each other. The pixel units are a first pixel unit 201A, a second pixel unit 201B, a third pixel unit 201C, and a fourth pixel unit 201D. The first black matrix layer I-I' or the second black matrix layer II-II' is disposed between pixel arrays of different colors. Since the adjacent pixel units (such as 201A, 201B, 201C, and 201D) have identical color; thus, color-mixing between the adjacent pixel units does not occur. Therefore, it may not be required to dispose a black matrix layer between the adjacent pixel units of identical color (at positions shown by dashed lines). Accordingly, the area ratio of the black matrix layer is reduced and the aperture ratio of the display panel is increased.

The colors of the pixel arrays of the second substrate 20' of Embodiment 2 may be red, green, blue, and white. However, a person skilled in the art may modify the colors of the pixel arrays to other four different colors as needed without particular limitation.

The arrangements and structures of the other units of Embodiment 2 that are similar to Embodiment 1 will not be described herein.

[Embodiment 3]

The wiring arrangement of a first substrate, which is an array substrate, and the configuration of the pixel units of a second substrate, which is a color filter substrate, of Embodiment 3 differ from that of Embodiment 1.

Figure 7:
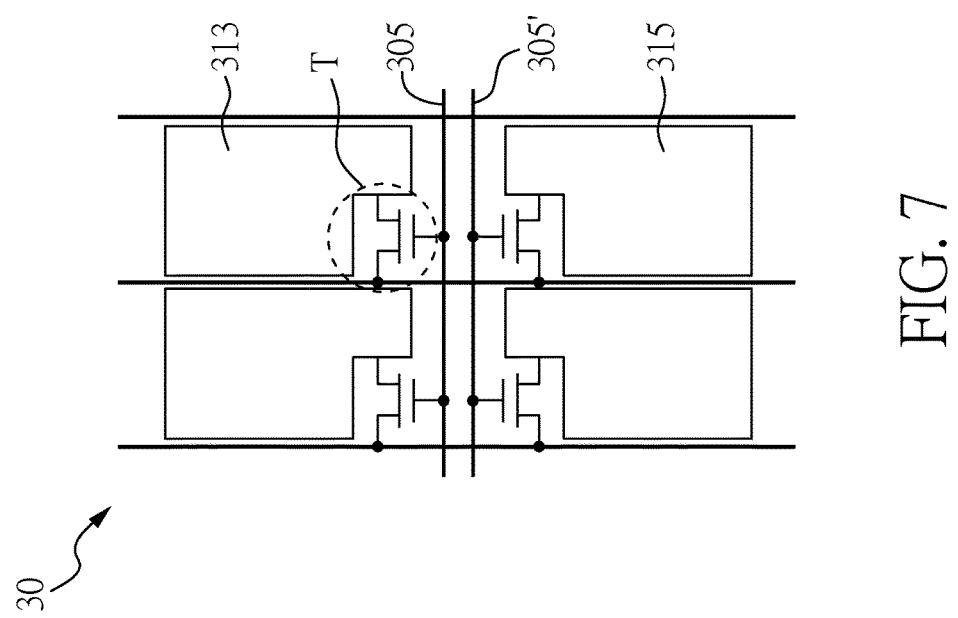
FIG. 7 is a schematic diagram of a wiring arrangement of a first substrate of Embodiment 3.

Please refer to FIG. 7, which is a schematic diagram of a wiring arrangement of a first substrate 30 of Embodiment 3. As shown in FIG. 7, Embodiment 3 again discloses a centralized arrangement of non-transparent units of adjacent pixels (such as first scan line 305, second scan line 305', and thin film transistor unit T) by adjusting the wiring arrangement of the first substrate 30.

Figure 8:
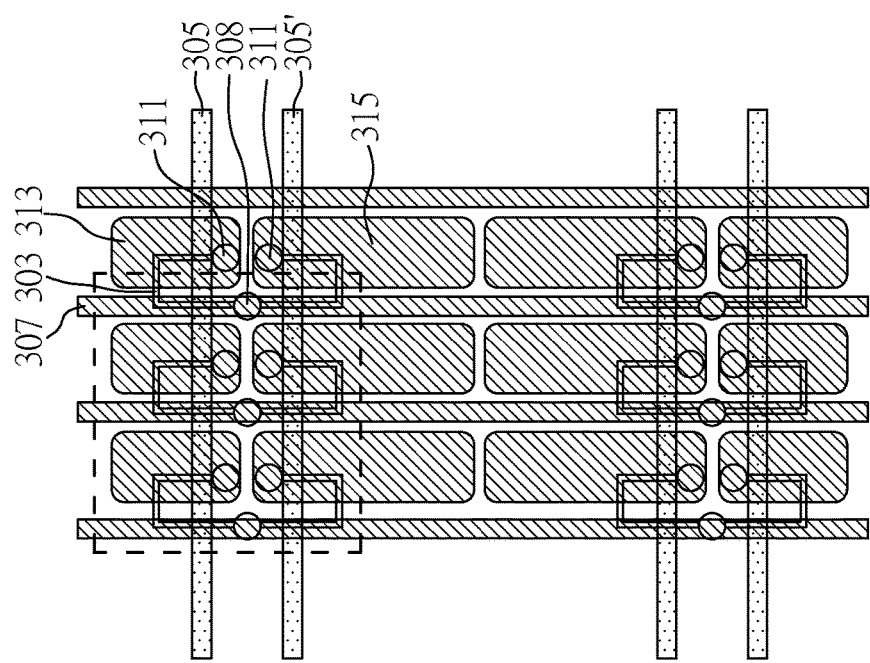
FIG. 8 is a schematic diagram of a wiring structure of a first substrate of Embodiment 3.

Please refer to FIG. 8, which is schematic diagram of a wiring structure of a first substrate 30 of Embodiment 3. Similar to Embodiment 1, FIG. 8 only shows the relative positions of units such as semiconductor layer 303; first scan line 305; second scan line 305'; data line 307; first contact via 308; second contact via 311; first pixel electrode layer 313; and second pixel electrode layer 315 in order to show the technical features of the present disclosure more clearly. As shown in FIG. 8, Embodiment 3 is similar to Embodiment 1 in that a data line 307 is electrically connected to a semiconductor layer 303 through a first contact via 308. In addition, the first contact via 308 and two second contact vias 311 are disposed between a first scan line 305 and a second scan line 305. Embodiment 3 is different from Embodiment 1 in that a first pixel electrode layer 313 and a second pixel electrode layer 315 are disposed at the same side of the data line 307. The arrangements and structures of the other units of Embodiment 3 that are similar to Embodiment 1 will not be described herein.

Figure 9:
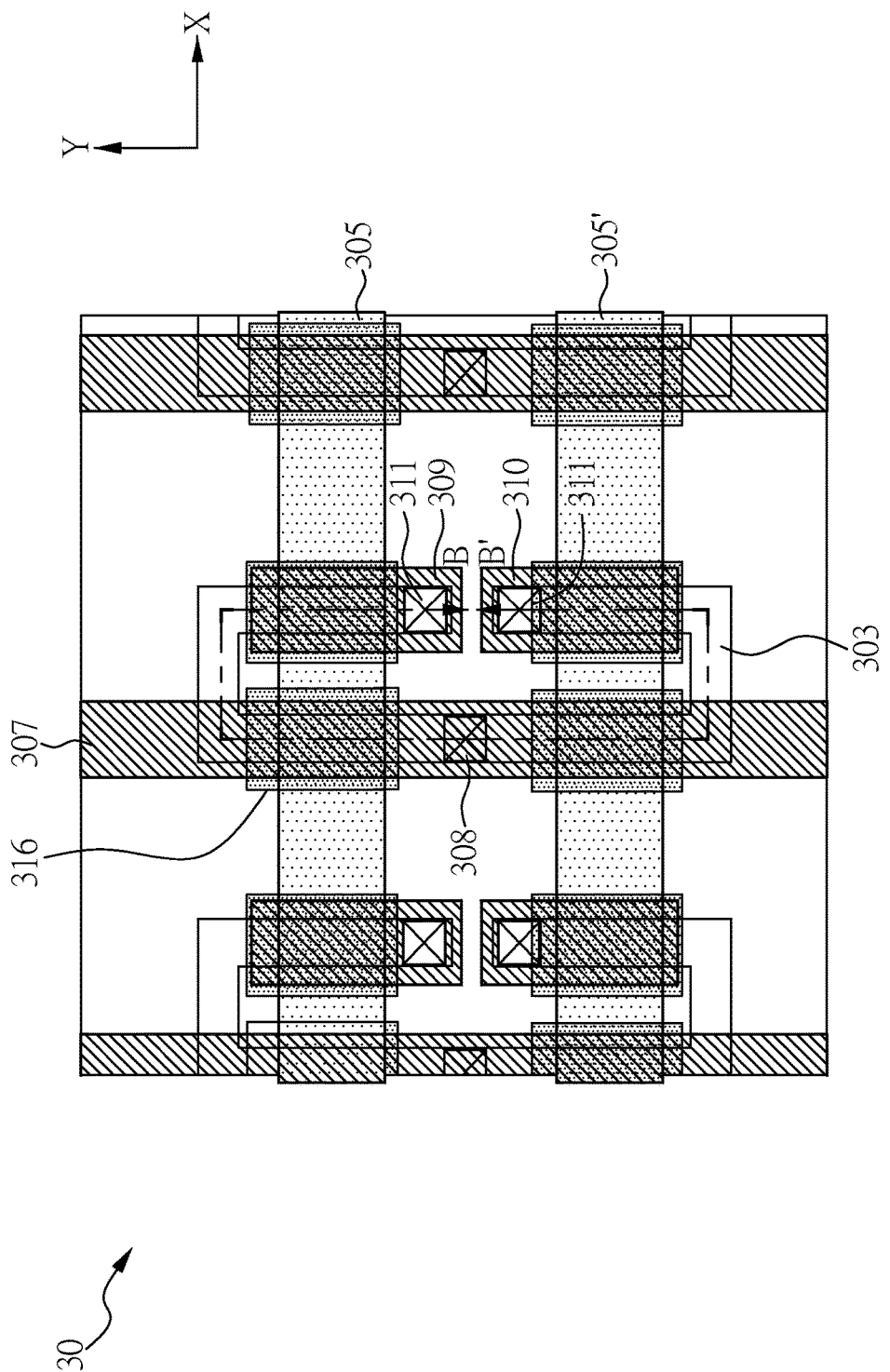
FIG. 9 is a top view of a first substrate of Embodiment 3.

Please refer to FIG. 9, which is a top view of a first substrate 30 of Embodiment 3 (corresponding to the dashed box in FIG. 8). In order to show the technical features of the present disclosure more clearly, some of the units (such as pixel electrode and third insulating layer) are omitted in FIG. 9. As shown in FIG. 9, a first metal pad 309 and a second metal pad 310 are electrically connected to the semiconductor layer 303 through the two second contact vias 311, respectively. The first contact via 308 and the two second contact vias 311 are disposed between the first scan line 305 and the second scan line 305'. The arrangements and structures of the other units of Embodiment 3 are similar to Embodiment 1 and a cross-sectional view along the B-B' cutting line of the first substrate 30 in FIG. 9 is similar to FIG. 5; hence, they will not be described herein.

In Embodiment 3, by adjusting the wiring arrangement and the wiring structure of the first substrate, active units of switches for sub-pixels may have a centralized arrangement. Consequently, the width of a black matrix layer on a second substrate, which is a color filter substrate, corresponding to a portion of the first substrate where the non-transparent active units are disposed may be increased. Meanwhile, the width of a black matrix layer on the second substrate that corresponds to a portion of the first substrate where the non-transparent active units are not disposed may be reduced. Subsequently, the total area ratio of black matrix layer may be reduced and the aperture ratio of display panel may be increased.

Figure 10:
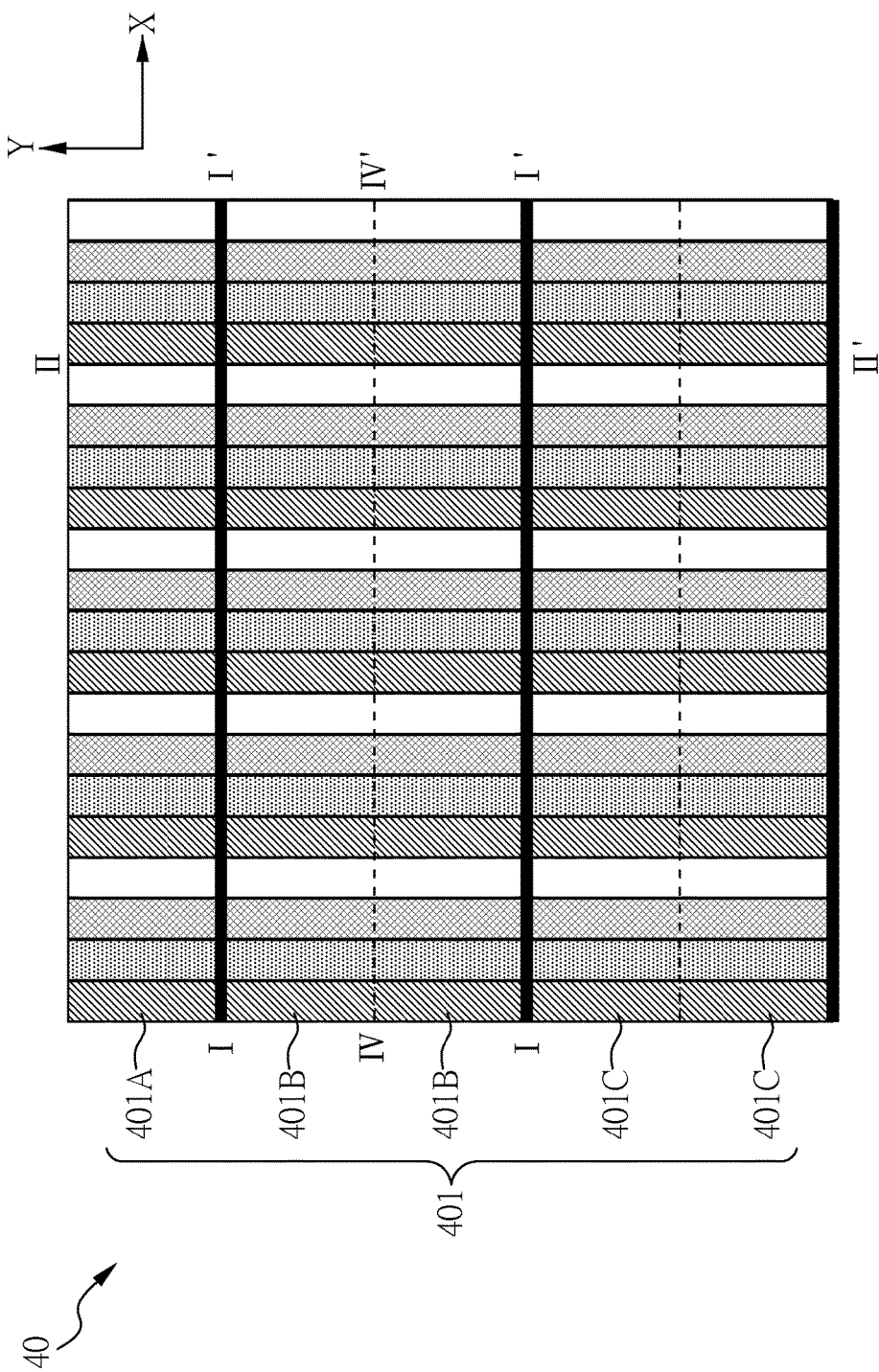
FIG. 10 is a schematic diagram of a second substrate of Embodiment 3.

Specifically, please refer to FIG. 10, which is a schematic diagram of a second substrate 40 of Embodiment 3. As shown in FIG. 10, the second substrate 40, which is a color filter substrate, comprises four rows of pixel arrays 401 of different colors (such as red, green, blue, and white). Each of the pixel arrays 401 comprises a plurality of pixel units 401A, 401B, 401C of identical color arranged and extended along the second direction (direction Y in FIG. 10). A first black matrix layer I-I' is disposed between two adjacent pixel units and another two adjacent pixel units of each pixel array (for example, between 401A and 401B or between 401B and 401C). Also, the first black matrix layer I-I' is disposed in a region that corresponds at least to the first scan line 305 and the second scan line 305'. A second black matrix layer II-II' is disposed between the pixel arrays of different colors. Also, the second black matrix layer II-II' is disposed in a region that corresponds at least to the data line 307. The width of the first black matrix layer I-I' is ranging from 5-50 μm and the width of the second black matrix layer II-II' is ranging from 2-20 μm. Since the adjacent pixel units (such as 401A, 401B, and 401C) have identical color; thus, color-mixing between the adjacent pixel units does not occur. Therefore, except at portions with non-transparent active units, it may not be required to dispose a black matrix layer between the adjacent pixel units of identical color (at positions shown by dashed lines). The area ratio of the black matrix layer is reduced and the aperture ratio of the display panel is increased.

The colors of the pixel arrays of the second substrate 40 of Embodiment 3 may be red, green, blue, and white. However, a person skilled in the art may modify the colors of red, green, and blue of the pixel arrays as needed without particular limitation.

Accordingly, as shown in FIG. 7 to FIG. 10, the total area ratio of the black matrix layers of the display panel of Embodiment 3 may be reduced by adjusting the wiring arrangement and the wiring structure of the first substrate 30, which is an array substrate, to improve the aperture ratio of the display panel.

[Embodiment 4]

The wiring arrangement of a first substrate, which is an array substrate, and the configuration of the pixel units of a second substrate, which is a color filter substrate, of Embodiment 4 differ from that of Embodiment 1.

Figure 11:
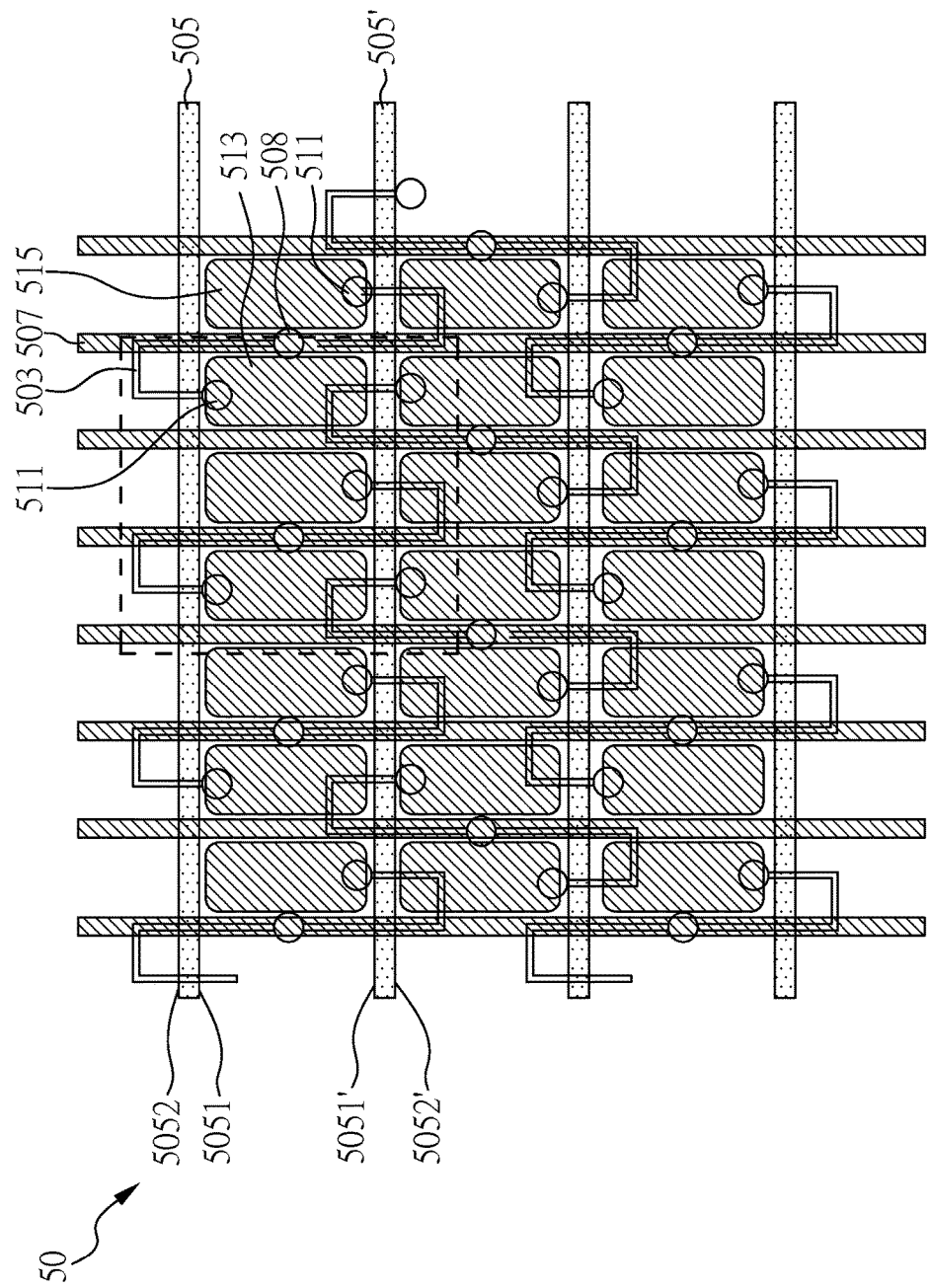
FIG. 11 is a schematic diagram of a wiring structure of a first substrate of Embodiment 4.

Please refer to FIG. 11, which is schematic diagram of a wiring structure of a first substrate 50 of Embodiment 4. Similar to Embodiment 1, FIG. 11 only shows the relative positions of units such as semiconductor layer 503; first scan line 505; second scan line 505'; data line 507; first contact via 508; second contact via 511; first pixel electrode layer 513; and second pixel electrode layer 515 in order to show the technical features of the present disclosure more clearly. As shown in FIG. 11 (top view), Embodiment 4 is different from Embodiment 1 in that a first pixel electrode layer 513 and a second pixel electrode layer 515 are disposed at different sides of a data line 307. Moreover, the first pixel electrode layer 513 and the second pixel electrode layer 515 are disposed between a first scan line 505 and a second scan line 505'. More specifically, the first scan line 505 has a first inner edge 5051 and a first outer edge 5052. The second scan line 505' also has a second inner edge 5051' and the second outer edge 5052'. The first inner edge 5051' is adjacent to the second inner edge 5051'. The first pixel electrode layer 513 and the second pixel electrode layer 515 are disposed between the first outer edge 5052 of the first scan line 505 and the second outer edge 5052' of the second scan line 505'. The arrangements and structures of the other units of Embodiment 3 that are similar to Embodiment 1 will not be described herein.

Figure 12:
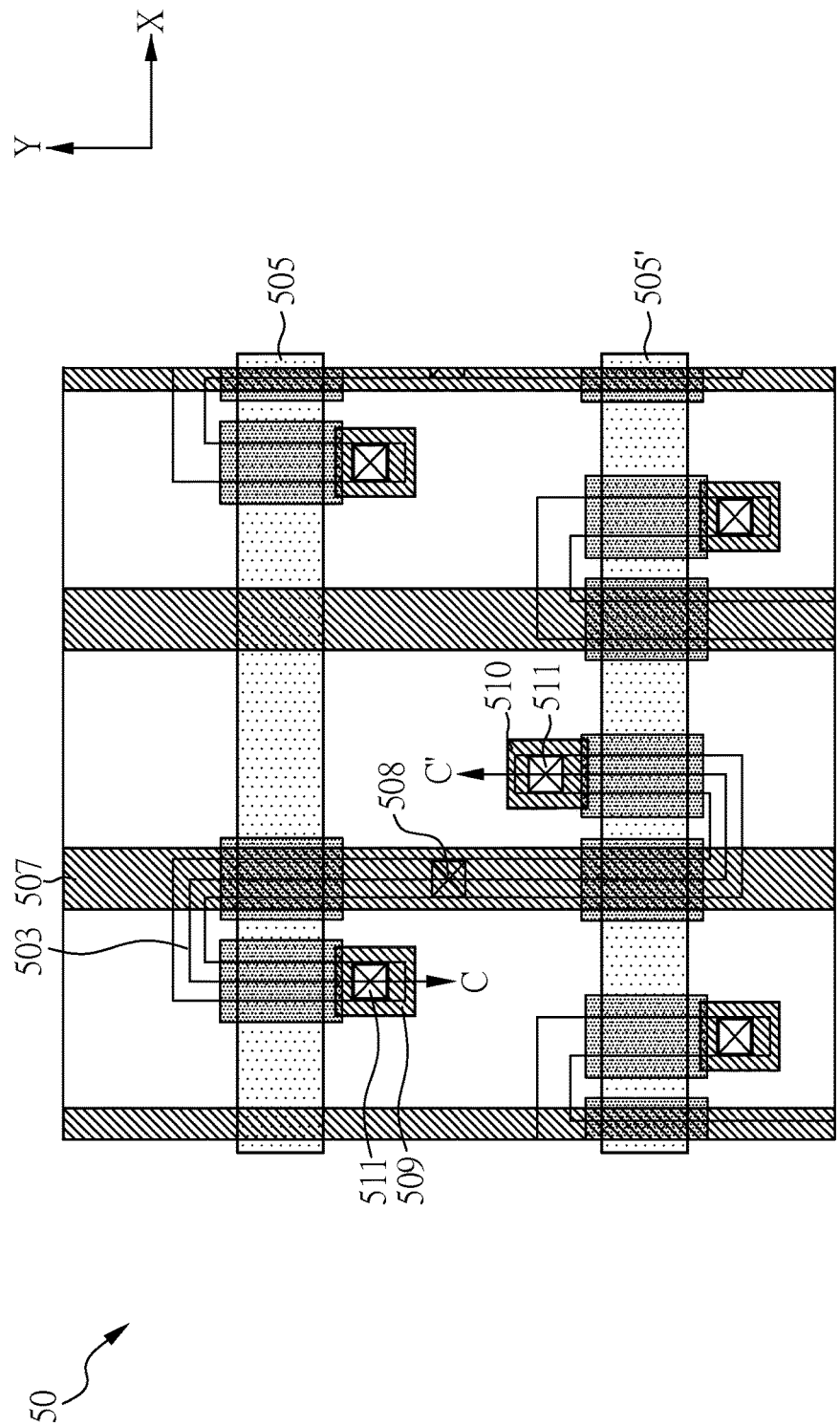
FIG. 12 is a top view of a first substrate of Embodiment 4.

Please refer to FIG. 12, which is a top view of a first substrate 50 of Embodiment 4 (corresponding to the dashed box in FIG. 11). In order to show the technical features of the present disclosure more clearly, some of the units (such as pixel electrode and third insulating layer) are omitted in FIG. 12. As shown in FIG. 12, Embodiment 4 is similar to Embodiment 1 in that a first metal pad 509 and a second metal pad 510 are electrically connected to a semiconductor layer 503 through two second contact vias 511, respectively. A first contact via 508 and the two second contact vias 511 are disposed between a first scan line 505 and a second scan line 505'. The arrangements and structures of the other units of Embodiment 4 are similar to Embodiment 1 and a cross-sectional view along the C-C' cutting line of the first substrate 50 in FIG. 12 is similar to FIG. 5; hence, they will not be described herein.

Figures 13A, 13B:
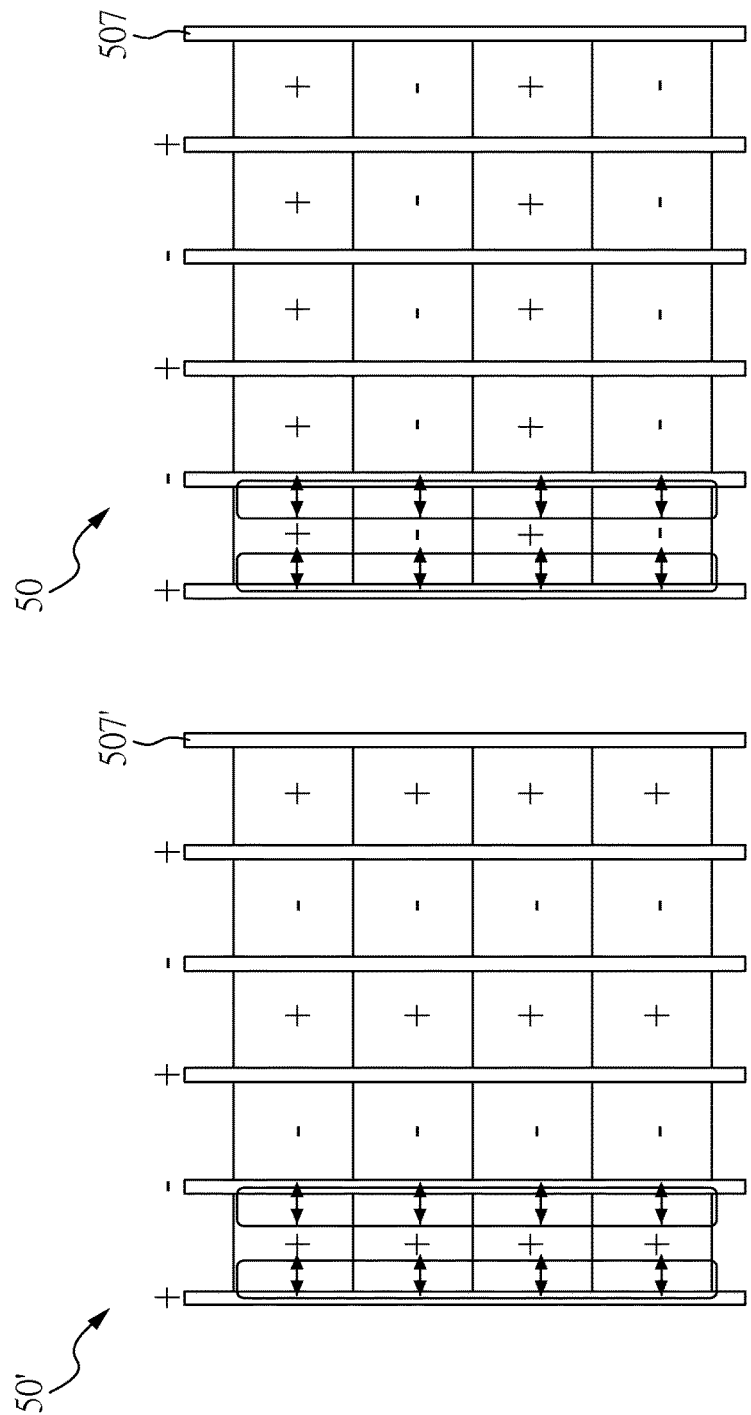
FIG. 13A is a schematic diagram of pixel polarities of a substrate with a wiring structure design known in the art.
FIG. 13B is a schematic diagram of pixel polarities of a first substrate of Embodiment 4.

Please refer to FIG. 13A, which is a schematic diagram of pixel polarities of a first substrate 50' with a wiring structure design known in the art. As shown in FIG. 13A, each data line 507' inputs an electrical signal to each pixel with a fixed positive or negative polarity. As a result, each column of pixels has the same polarity and different columns of pixels have different polarities. Since adjacent columns of pixels have opposite polarities, crosstalk occurs very easily between each pixel. Please also refer to FIG. 13B, which is a schematic diagram of pixel polarities of a first substrate 50 of Embodiment 4. As shown in FIG. 13B, each data line 507 of Embodiment 4 still inputs an electrical signal to each pixel with a fixed positive or negative polarity. However, with the wiring arrangement design of Embodiment 4 and by using column inversion to drive pixels, adjacent columns of pixel polarities are the same, and crosstalk does not occur easily between each pixel. Accordingly, the first substrate 50 of Embodiment 4 has features such as low crosstalk and low power consumption.

In Embodiment 4, by adjusting the wiring arrangement and the wiring structure of the first substrate, active units of switches for sub-pixels may have a centralized arrangement. The position of a black matrix layer on a second substrate, which is a color filter substrate, corresponding to a portion of the first substrate where non-transparent active units are disposed may be adjusted. Pixel arrays with pixel units of an identical color may be configured to correspond to switches of adjacent sub-pixels not sharing the same first contact via. Consequently, the total area ratio of black matrix layer may be reduced and the aperture ratio of display panel may be increased.

Figure 14:
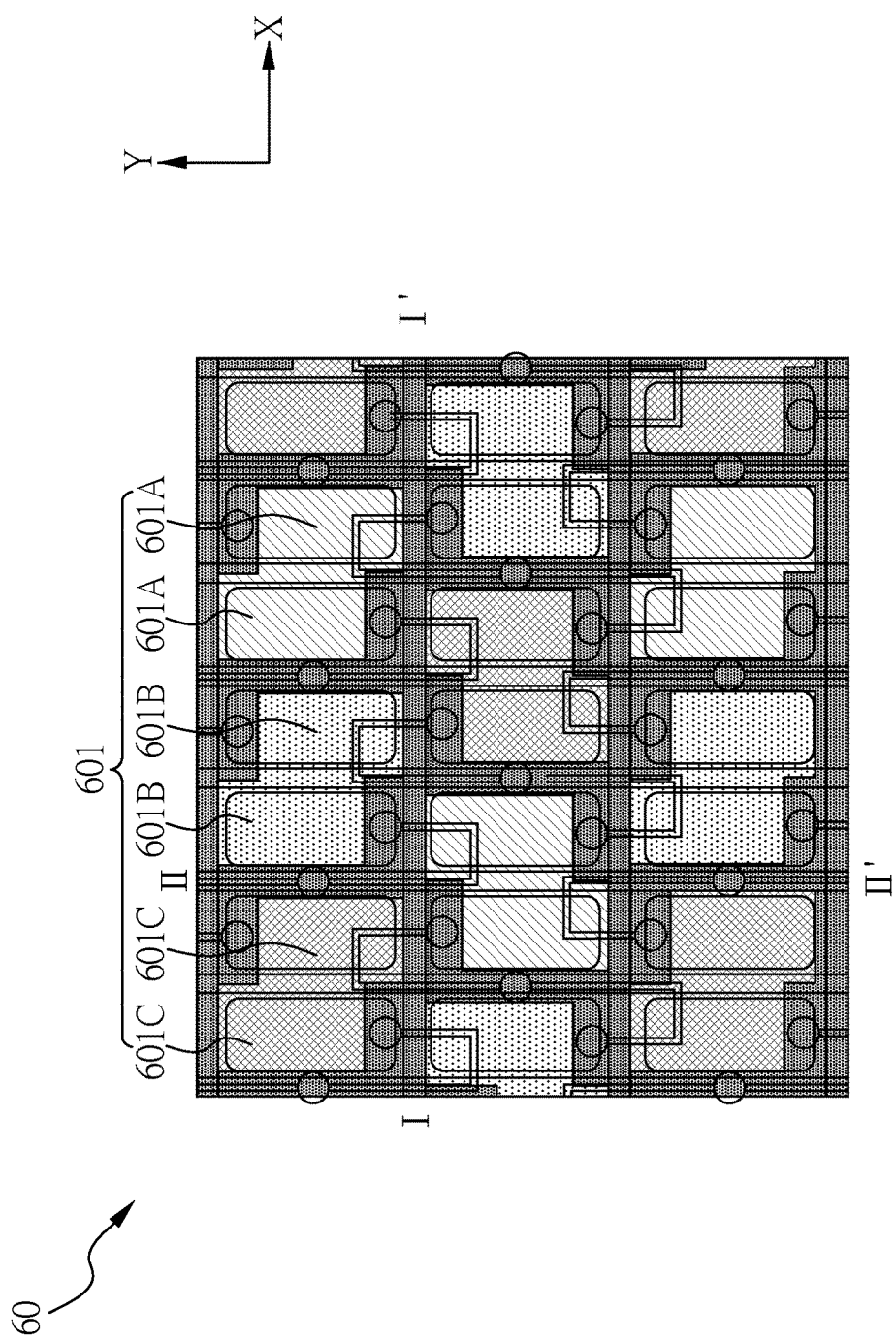
FIG. 14 is a schematic diagram of an overlap between a first substrate and a second substrate of Embodiment 4.

Specifically, please refer to FIG. 14, which is a schematic diagram of a second substrate 60 corresponding to the first substrate 50 in FIG. 11 of Embodiment 4. In order to show the relative positions of black matrix layers and pixel arrays of the second substrate 60 and the wiring of the first substrate 50 more clearly, FIG. 14 shows the second substrate 60 in view of its overlap with parts of the wiring of the first substrate 50. As shown in FIG. 14, the second substrate 60, which is a color filter substrate, comprises a plurality of pixel arrays 601 having at least three different colors (such as red, green, and blue). Each of the pixel arrays 601 comprises two pixel units of an identical color adjacent to each other (601A, 601B, and 601C) and arranged along the first direction (direction X in FIG. 14), wherein the colors of the pixel units 601A, 601B, 601C are different. A first black matrix layer I-I' is disposed between the pixel arrays 601 and extended along the first direction (direction X in FIG. 14). A second black matrix layer II-II' is disposed between two adjacent pixel units of different colors (at positions such as between 601A and 601B, 601B and 601C, or 601C and 601A). Since the adjacent pixel units (601A, 601B, or 601C) have an identical color; thus, color-mixing between the adjacent pixel units of identical color (601A, 601B, or 601C) does not occur. Therefore, it may not be required to dispose the second black matrix layer II-II' between the adjacent pixel units of identical color (601A, 601B or 601C) (at positions such as between the two pixel units 601A or 601B or 601C). Subsequently, the area ratio of the black matrix layer is reduced and the aperture ratio of the display panel is increased.

Although the pixel units of Embodiment 4 are in rectangular shapes; however, as long as the requirement of known black matrix layer can be met and the aperture ratio can be increased, any shapes of black matrix layer can be used; and hence, the shape of the pixel units of the present disclosure is not particularly limited. The colors of the pixel arrays of the second substrate 60 of Embodiment 4 may be red, green, and blue. However, a person skilled in the art may modify the colors of the pixel arrays of the second substrate 60 of Embodiment 4 to be red, green, blue, and white as needed without particular limitation.

Even though the present disclosure has been explained in relation to its various embodiments; however, it is to be understood that many other possible modifications and variations can be made without departing from the spirit and scope of the disclosure as hereinafter claimed.

What is claimed is:

1. A display panel, comprising a first substrate, a display layer, and a second substrate, wherein the display layer is disposed between the first substrate and the second substrate; and the first substrate comprises:
    a base substrate;
    a semiconductor layer disposed on the base substrate;
    a first insulating layer disposed on the semiconductor layer;
    a first scan line and a second scan line disposed on the first insulating layer and extended along a first direction respectively, and portions of the first and the second scan lines overlapping with the semiconductor layer;
    a second insulating layer disposed on the first scan line, the second scan line, and the first insulating layer;
    a third insulating layer disposed on the first metal pad, the second metal pad, and the second insulating layer;
    a data line disposed on the second insulating layer and extended along a second direction, and the data line electrically connecting to the semiconductor layer through a first contact via, wherein the second direction is different from the first direction;
    a first metal pad and a second metal pad disposed on the second insulating layer, and the first metal pad and the second metal pad electrically connecting to the semiconductor layer through two second contact via respectively;
    a first pixel electrode layer disposed on the third insulating layer, wherein the first pixel electrode layer electrically connects to the first metal pad through a third contact via;
    a second pixel electrode layer disposed on the third insulating layer, wherein the second pixel electrode layer electrically connects to the second metal pad through another third contact via; and
    wherein the first contact via and the two second contact vias are disposed between the first scan line and the second scan line.

2. The display panel of claim 1, wherein the first pixel electrode layer and the second pixel electrode layer are disposed adjacently at the same side of the data line.

3. The display panel of claim 1, wherein the first pixel electrode layer and the second pixel electrode layer are disposed adjacently at different sides of the data line, and the first scan line has a first inner edge and a first outer edge, the second scan line has a second inner edge and a second outer edge, and the first inner edge is adjacent to the second inner edge.

4. The display panel of claim 3, wherein the first pixel electrode layer overlaps with the first inner edge and the first outer edge of the first scan line, and the second pixel electrode layer overlaps with the second inner edge and the second outer edge of the second scan line.

5. The display panel of claim 3, wherein the first pixel electrode layer and the second pixel electrode layer are disposed between the first outer edge of the first scan line and the second outer edge of the second scan line.

6. The display panel of claim 1, further comprising a plurality of light-shielding layers disposed between the base substrate and the semiconductor layer, wherein the light-shielding layers are disposed in regions corresponding to an area of the semiconductor layer which overlaps with the first scan line and another area of the semiconductor layer which overlaps with the second scan line.

7. The display panel of claim 6, further comprising a buffer layer disposed between the base substrate and the semiconductor layer, wherein the light-shielding layers are disposed between the base substrate and the buffer layer.

8. The display panel of claim 1, further comprising a first black matrix layer and a second black matrix layer disposed between the first substrate and the second substrate, wherein the first black matrix layer covers at least the first scan line or the second scan line, and the second black matrix layer covers at least the data line.

9. The display panel of claim 8, wherein a width of the first black matrix layer is in a range from 5μm to 50μm.

10. The display panel of claim 8, wherein the second substrate is a color filter substrate, and the second substrate comprises at least four pixel arrays of different colors, each of the pixel arrays comprises four pixel units of an identical color adjacent to each other, which are a first pixel unit, a second pixel unit, a third pixel unit, and a fourth pixel unit, and the first black matrix layer or the second black matrix layer is disposed between the pixel arrays of different colors.

11. The display panel of claim 8, wherein the second substrate is a color filter substrate, and the second substrate comprises at least three rows of pixel arrays of different colors, each of the pixel arrays comprises a plurality of pixel units of an identical color arranged along the second direction, and the first black matrix layer is disposed between two adjacent pixel units and another two adjacent pixel units of each pixel array.

12. The display panel of claim 1, further comprising a first black matrix layer and a second black matrix layer disposed between the first substrate and the second substrate, wherein the first black matrix layer covers at least the first scan line or the second scan line, and the second black matrix layer covers at least a portion of the data line.

13. The display panel of claim 12, wherein the second substrate is a color filter substrate, and the second substrate comprises at least three pixel arrays of different colors, each of the pixel arrays comprises two pixel units of an identical color adjacent to each other and arranged along the first direction, and the first black matrix layer is disposed between the pixel arrays.

* * * * *